US010234099B2

(12) United States Patent
Shinohara

(10) Patent No.: US 10,234,099 B2
(45) Date of Patent: Mar. 19, 2019

(54) LIGHT FLUX CONTROLLING MEMBER, LIGHT EMITTING DEVICE, SURFACE LIGHT SOURCE DEVICE AND DISPLAY APPARATUS

(71) Applicant: Enplas Corporation, Saitama (JP)

(72) Inventor: Hiroyuki Shinohara, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 59 days.

(21) Appl. No.: 15/507,003

(22) PCT Filed: Jun. 12, 2015

(86) PCT No.: PCT/JP2015/066979
§ 371 (c)(1),
(2) Date: Feb. 27, 2017

(87) PCT Pub. No.: WO2016/031346
PCT Pub. Date: Mar. 3, 2016

(65) Prior Publication Data
US 2017/0254506 A1 Sep. 7, 2017

(30) Foreign Application Priority Data

Aug. 29, 2014 (JP) .................... 2014-175671
Mar. 23, 2015 (JP) .................... 2015-059483

(51) Int. Cl.
*F21V 5/04* (2006.01)
*F21V 3/02* (2006.01)
(Continued)

(52) U.S. Cl.
CPC .................... *F21V 5/04* (2013.01);
*F21S 2/00* (2013.01); *F21V 3/02* (2013.01);
*G02B 19/0028* (2013.01);
(Continued)

(58) Field of Classification Search
CPC . F21V 5/04; F21V 5/046; F21V 5/048; F21V 3/02
See application file for complete search history.

(56) References Cited

U.S. PATENT DOCUMENTS 9,853,189 B2 * 12/2017 Song ............... H01L 33/145
2012/0120324 A1 * 5/2012 Yoshikawa ....... G02F 1/133608
348/739
(Continued)

FOREIGN PATENT DOCUMENTS

CN 2788226 Y 6/2006
CN 103527974 A 1/2014
(Continued)

OTHER PUBLICATIONS

International Search Report from International Application No. PCT/JP2015/066979 dated Sep. 8, 2015.

*Primary Examiner* — Alan B Cariaso
(74) *Attorney, Agent, or Firm* — Brundidge & Stanger, P.C.

(57) ABSTRACT

A light-beam control member according to the present invention includes: an entrance face and an exit face. The exit face includes: a first exit face constituting an inner face of a second concave portion located so as to intersect the central axis; and a second exit face constituting a convex curved face located so as to surround the first exit face. The second exit face has multiple, circular ring-shaped convex portions disposed concentrically about the central axis and projecting in the direction along the central axis. The pitch of the convex portions in the direction perpendicular to the central axis in a cross section including the central axis is constant.

8 Claims, 20 Drawing Sheets

(51) Int. Cl.
  *F21S 2/00*  (2016.01)
  *G02B 19/00* (2006.01)
  *H01L 33/58* (2010.01)
  *F21Y 105/16* (2016.01)
  *F21Y 115/10* (2016.01)

(52) U.S. Cl.
  CPC ...... *G02B 19/0061* (2013.01); *F21Y 2105/16* (2016.08); *F21Y 2115/10* (2016.08); *H01L 33/58* (2013.01)

(56) References Cited

U.S. PATENT DOCUMENTS

| | | |
|---|---|---|
| 2014/0009944 A1 | 1/2014 | Fukuda |
| 2015/0055347 A1 | 2/2015 | Kim et al. |
| 2015/0117016 A1* | 4/2015 | Kim .................... F21K 9/64 |
| | | 362/293 |
| 2015/0117028 A1* | 4/2015 | Wang He ............. F21V 5/048 |
| | | 362/311.02 |
| 2015/0354786 A1* | 12/2015 | Ji ........................ F21V 5/04 |
| | | 315/297 |
| 2016/0230954 A1* | 8/2016 | Ha ..................... F21V 5/048 |

FOREIGN PATENT DOCUMENTS

| | | |
|---|---|---|
| JP | 2006-114863 A | 4/2006 |
| JP | 2007-005218 A | 1/2007 |
| JP | 2011-34770 A | 2/2011 |
| JP | 2015-043427 A | 3/2015 |
| KR | 10-1301206 B1 | 8/2013 |

* cited by examiner

LIGHT FLUX CONTROLLING MEMBER, LIGHT EMITTING DEVICE, SURFACE LIGHT SOURCE DEVICE AND DISPLAY APPARATUS

TECHNICAL FIELD

The present invention relates to a light flux controlling member, and a light-emitting device, a surface light source device and a display device including the light flux controlling member.

BACKGROUND ART

Some transmission type image display apparatuses such as liquid crystal display apparatuses and sign boards use a direct surface light source device as a backlight. In recent years, direct surface light source devices having a plurality of light emitting elements as the light source are used. In such surface light source devices, a light flux controlling member for controlling the distribution of the light emitted from the light emitting element is disposed over the light emitting element (see, for example, PTL 1).

FIG. 1 is a sectional view of surface light source device 10 disclosed in PTL 1. As illustrated in FIG. 1, surface light source device 10 includes light-emitting device 20, and light diffusion member 30 disposed on light-emitting device 20 with an air layer therebetween. In addition, light-emitting device 20 includes light emitting element 40, and a lens (light flux controlling member) 50 disposed on light emitting element 40. Lens 50 is a condenser lens including incidence surface 51 disposed on light emitting element 40 side, reflecting surface 52 disposed to surround incidence surface 51 and configured to reflect light incident on incidence surface 51, and emission surface 53 configured to emit light incident on incidence surface 51 and light incident on incidence surface 51 which is reflected by reflecting surface 52. In addition, in surface light source device 10 disclosed in PTL 1, a light diffusion treatment is performed on incidence surface 51, reflecting surface 52 or emission surface 53. A part of light emitted from light emitting element 40 which is incident on incidence surface 51 is reflected by reflecting surface 52 and then emitted from emission surface 53 to the outside. In addition, the other part of light emitted from light emitting element 40 which is incident on incidence surface 51 is emitted from emission surface 53 to the outside without being reflected by reflecting surface 52. In lens 50 of surface light source device 10 disclosed in PTL 1, incidence surface 51, reflecting surface 52 or emission surface 53 is subjected to a light diffusion treatment to prevent color unevenness in light diffusion member 30.

CITATION LIST

Patent Literature

PTL 1
Japanese Patent Application Laid-Open No. 2007-005218

SUMMARY OF INVENTION

Technical Problem

In surface light source device 10 disclosed in PTL 1, incidence surface 51, reflecting surface 52 or emission surface 53 of lens 50 is subjected to a light diffusion treatment. Here, in the case where, in lens 50 which has a desired light distribution property in the state where it is subjected to no light diffusion treatment, incidence surface 51, reflecting surface 52 or emission surface 53 is subjected to a light diffusion treatment, light is scattered on the surface subjected to the light diffusion treatment, and consequently a desired light distribution property cannot be achieved. While lens 50 disclosed in PTL 1 is a so-called condenser lens, the same applies to a so-called diffusion lens which smoothly spreads light emitted from light emitting element 40.

In view of this, an object of the present invention is to provide a light flux controlling member which can suppress color unevenness of emission light without performing a light diffusion treatment on an optical surface. In addition, another object of the present invention is to provide a light emitting element, a surface light source device and a display device including the light flux controlling member.

Solution to Problem

A light flux controlling member according to an embodiment of the present invention is disposed such that an optical axis of light emitted from a light emitting element and a central axis of the light flux controlling member coincide with each other, the light flux controlling member being configured to control a distribution of the light emitted from the light emitting element, and including: an incidence surface composed of an internal surface of a first recess and configured to allow incidence of the light emitted from light emitting element, the first recess being disposed on the light emitting element side to intersect the central axis; and an emission surface disposed on a side opposite to the incidence surface to intersect the central axis, and configured to emit light incident on the incidence surface to outside of the light flux controlling member. The emission surface includes a first emission surface composed of an internal surface of a second recess disposed to intersect the central axis, and a second emission surface composed of a protruding curved surface disposed to surround the first emission surface, the second emission surface includes a plurality of annular protrusions concentrically disposed around the central axis and protruded in a direction along the central axis, and a pitch of the protrusions in a direction perpendicular to the central axis is constant in a cross section including the central axis.

A light-emitting device according to the embodiment of the present invention includes: a light emitting element; and the light flux controlling member.

A surface light source device according to the embodiment of the present invention includes: the light-emitting device; and a light diffusion member configured to allow light from the light-emitting device to pass therethrough while diffusing the light.

A display device according to the embodiment of the present invention includes: the surface light source device; and a display member to which light emitted from the surface light source device is applied.

Advantageous Effects of Invention

With the light flux controlling member of the embodiment of the present invention, a desired light distribution can be achieved while suppressing color unevenness. Therefore, according to the present invention, it is possible to provide a surface light source device and a display device which can suppress luminance unevenness and color unevenness.

DESCRIPTION OF EMBODIMENTS

In the following, an embodiment of the present invention is described in detail with reference to the accompanying drawings. Here, as a typical example of the surface light source device according to the embodiment of the present invention, a surface light source device suitable for a backlight of a liquid crystal display apparatus will be described. When used with a display member (for example, a liquid crystal panel) to which light from surface light source device is applied, the surface light source device can be used as a display apparatus.

[Configuration of Surface Light Source Device and Light-emitting Device]

Figure 1:
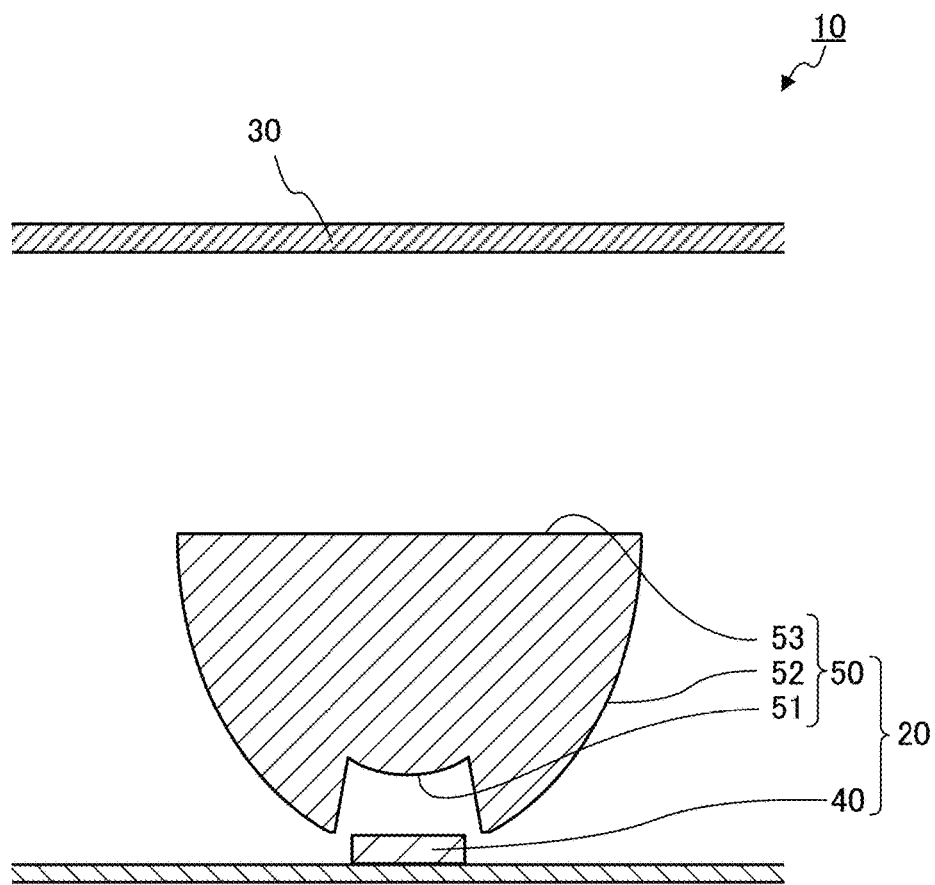
FIG. 1 is a sectional view of a surface light source device disclosed in PTL 1.
Figure 2A:
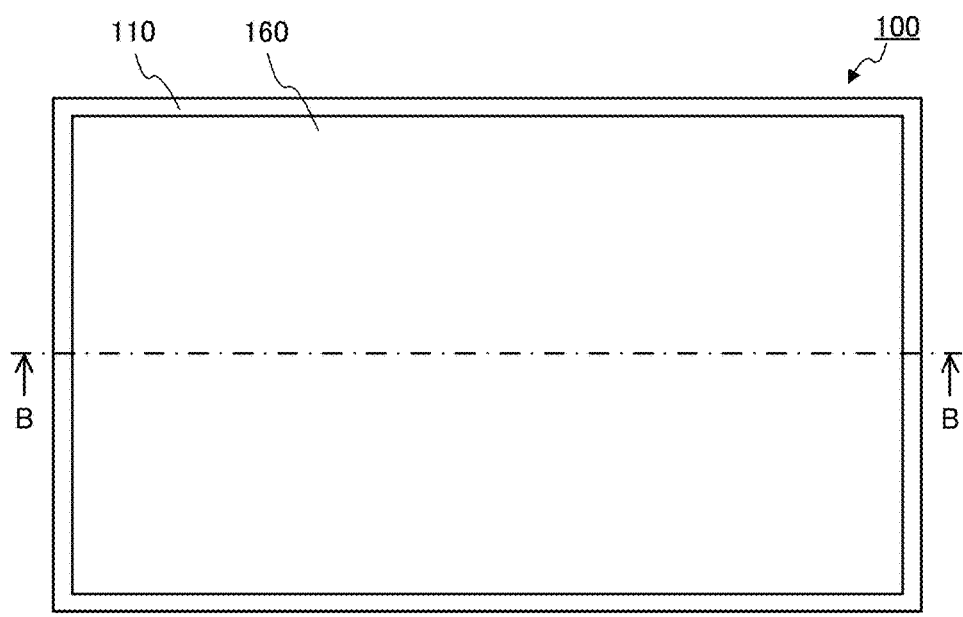
FIG. 2A and FIG. 2B illustrate a configuration of a surface light source device according to an embodiment.
Figure 2B:
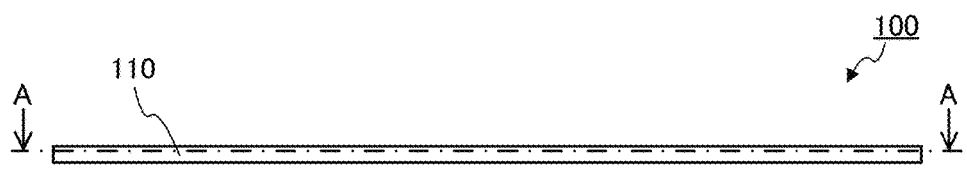
Figure 3A:
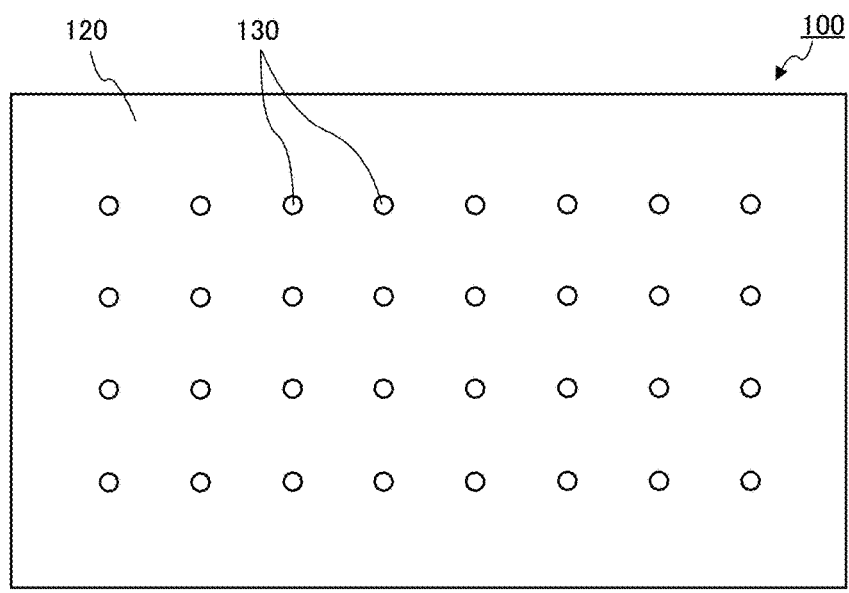
FIG. 3A and FIG. 3B are sectional views illustrating a configuration of the surface light source device according to the embodiment.
Figure 3B:
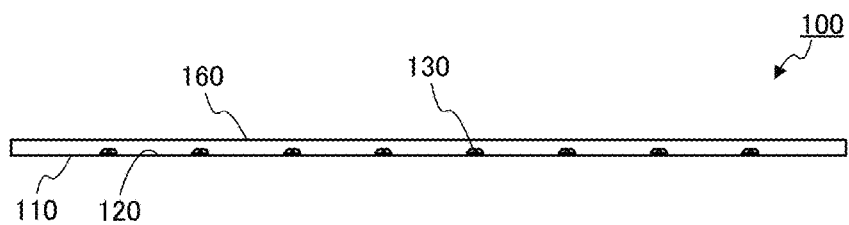
Figure 4:
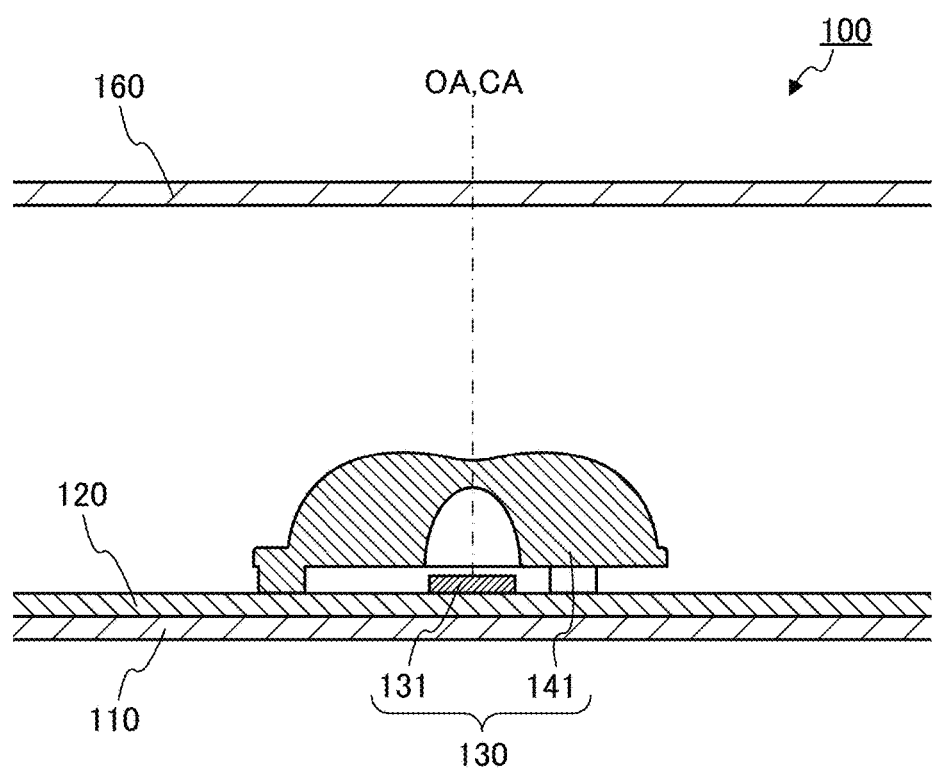
FIG. 4 is a partially enlarged sectional view of FIG. 3B.

FIG. 2 to FIG. 4 illustrate a configuration of surface light source device 100 according to the embodiment of the present invention. FIG. 2A is a plan view of surface light source device 100, and FIG. 2B is a side view of surface light source device 100. FIG. 3A is a sectional view taken along line A-A of FIG. 2B, and FIG. 3B is a sectional view taken along line B-B of FIG. 2A. FIG. 4 is an enlarged sectional view illustrating a part of FIG. 3B.

As illustrated in FIG. 2A to FIG. 4, surface light source device 100 according to the present embodiment includes casing 110, substrate 120, a plurality of light-emitting devices 130 and light diffusion member 160. Substrate 120 is disposed on the bottom plate of casing 110, and light-emitting devices 130 are disposed on substrate 120 at a constant interval. The top plate of casing 110 is provided with an opening. Light diffusion member 160 is disposed over light-emitting devices 130 to close the opening such that light diffusion member 160 is substantially parallel to substrate 120 and functions as a light emitting surface. The size of light emitting surface is, but not limited to, about 400 mm×about 700 mm, for example.

Each light-emitting device 130 is fixed on substrate 120. Each light-emitting device 130 includes light emitting element 131 and light flux controlling member 141.

Light emitting element 131 is a light source of surface light source device 100. Light emitting element 131 is a light-emitting diode (LED) such as a white light-emitting diode for example.

Light flux controlling member 141 controls the distribution of light emitted from light emitting element 131. Light flux controlling member 141 is disposed over light emitting element 131 such that the central axis CA of light flux controlling member 141 coincides with optical axis OA of light emitting element 131. Here, the "the optical axis of the light emitting element" means a central light beam of a stereoscopic light flux from light emitting element 131. The optical axis of light-emitting device 130 coincides with optical axis OA of light emitting element 131 and central axis CA of light flux controlling member 141 (see FIG. 4). A gap for dissipating the heat emitted from light emitting element 131 to the outside is formed between substrate 120 and light flux controlling member 141.

Light flux controlling member 141 is formed by integral shaping. The material of light flux controlling member 141 is not limited as long as light of a desired wavelength can pass therethrough. Examples of the material of light flux controlling member 141 include: light transmissive resins such as polymethylmethacrylate (PMMA), polycarbonate (PC), and epoxy resin (EP); or glass. The shape of controlling member 141 will be separately described in detail.

Light diffusion member 160 is a plate-shaped member having a light diffusing property, and allows the light emitted from light-emitting device 130 to pass therethrough while diffusing the light. Normally, the size of light diffusion member 160 is substantially the same as that of the member to be irradiated, such as a liquid crystal panel. For example, light diffusion member 160 is formed of a light transmissive resin such as polymethylmethacrylate (PMMA), polycarbonate (PC), polystyrene (PS), and styrene methyl methacrylate copolymerization resin (MS). For the purpose of providing a light diffusing property, minute irregularities are formed on the surface of light diffusion member 160, or diffusing members such as beads are dispersed in light diffusion member 160.

The light emitted from light emitting element 131 is spread in the radial direction (the direction away from central axis CA) by light flux controlling member 141. This effect is significant in light having a small angle to central axis CA in the light flux emitted from light emitting element 131. The light emitted from light-emitting device 130 reaches light diffusion member 160. The light reaching light diffusion member 160 passes through light diffusion member 160 while being diffused.

[Configuration of Light Flux Controlling Member]

Figure 5A:
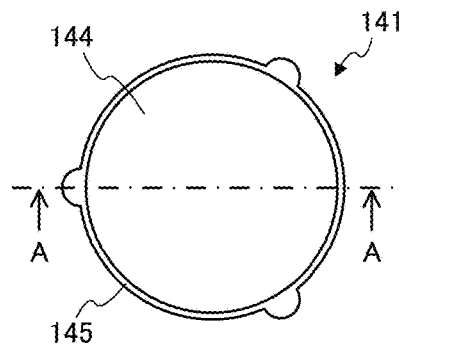
FIG. 5A to FIG. 5E illustrate a configuration of a light flux controlling member according to the embodiment.
Figure 5C:
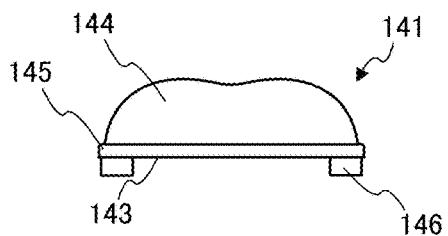
Figure 5B:
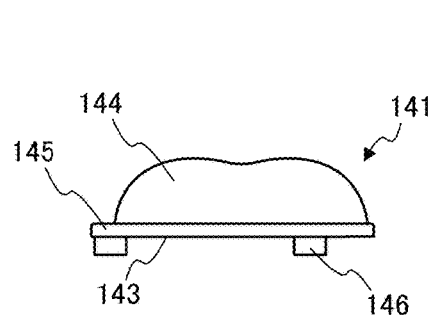
Figure 5D:
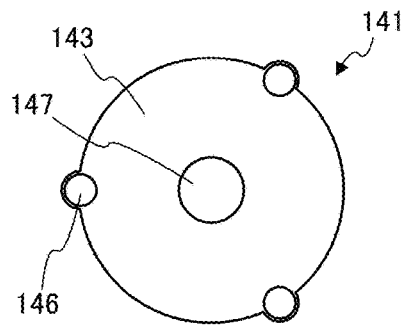
Figure 5E:
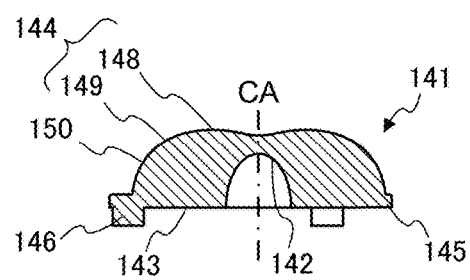

FIG. 5A to FIG. 5E illustrate a configuration of light flux controlling member 141 according to the present embodiment. FIG. 5A is a plan view of light flux controlling member 141, FIG. 5B is a front view of light flux controlling member 141, FIG. 5C is a rear view of light flux controlling member 141, FIG. 5D is a bottom view of light flux controlling member 141, and FIG. 5E is a sectional view taken along line A-A of FIG. 5A.

As illustrated in FIG. 5A to FIG. 5E, light flux controlling member 141 includes incidence surface 142, rear surface 143, emission surface 144, flange part 145 and a plurality of leg parts 146.

Incidence surface 142 is the internal surface of first recess 147 which is disposed on light emitting element 131 side at a center portion on the lower side of light flux controlling member 141 so as to intersect central axis CA. Incidence surface 142 allows light emitted from light emitting element 131 to enter light flux controlling member 141 while controlling the travelling direction thereof. The shape of incidence surface 142 is not limited. In the present embodiment, incidence surface 142 is an aspherical surface having a semi-ellipse shape in cross section. In addition, incidence surface 142 is rotationally symmetrical about central axis CA.

Rear surface 143 is a plane which is located on the lower side (light emitting element 131 side) of light flux controlling member 141 and extends from the opening edge of first recess 147 in the radial direction (a direction perpendicular to central axis CA). On rear surface 143, a plurality of leg parts 146 are disposed at even intervals.

Emission surface 144 emits, to the outside, the light having entered light flux controlling member 141 from incidence surface 142 while controlling the travelling direction of the light. Emission surface 144 is disposed on light emitting element 131 side to intersect central axis CA, and protrudes upward (light diffusion member 160 side) relative to flange part 145.

Emission surface 144 includes first emission surface 148 located in a predetermined range around central axis CA of light flux controlling member 141, and second emission surface 149 continuously formed at the periphery of first emission surface 148 (see FIG. 5E).

First emission surface 148 is the internal surface of a second recess protruding downward (to light emitting element 131 side) which is disposed at a position to intersect central axis CA of light flux controlling member 141 (optical axis OA of light emitting element 131). In other words, the second recess (first emission surface 148) is disposed at a position to intersect central axis CA (optical axis OA of light emitting element 131) of emission surface 144 of light flux controlling member 141 formed in a protruding curved shape as a whole. It is to be noted that first emission surface 148 may be formed such that the generatrix from the central axis to the external edge of first emission surface 148 (the shape of first emission surface 148 in the cross section including central axis CA) is a curve which is recessed with respect to the lower side (the light emitting element 131 side) (or protruded upward (to the light diffusion member 160 side)).

Second emission surface 149 is a curved surface (protruding curved surface) protruding upward (to light diffusion member 160 side) as a whole which is disposed to surround first emission surface 148. Second emission surface 149 has a protruding shape obtained by cutting out a part of an annular surface as a whole. As described in detail later, a plurality of minute annular protrusions 150 are formed on emission surface 144 (see FIG. 7A to FIG. 8B). It is to be noted that, although not illustrated in the drawings, emission surface 144 may have a third emission surface around second emission surface 149. In the cross section including central axis CA, the third emission surface may have a linear shape, or a curved shape.

In the case of first emission surface 148 whose generatrix from the central axis to the external edge is a curve which is recessed with respect to the lower side (the light emitting element 131 side) (or protruded upward (to the light diffusion member 160 side)), the boundary between first emission surface 148 and second emission surface 149 may be the middle point between the apex of emission surface 144 and the intersection of first emission surface 148 with central axis CA in a direction along central axis CA, and the like.

Flange part 145 is located between the outer periphery part of emission surface 144 and the outer periphery part of rear surface 143, and is radially outwardly protruded. Flange part 145 has a substantially annular shape. Flange part 145 may be omitted; however, with flange part 145, ease of handling and alignment of light flux controlling member 141 is increased. The thickness of flange part 145 is not limited, and is determined in consideration of the desired planar dimension of emission surface 144, workability of flange part 145 and the like.

Leg parts 146 are columnar-shaped members protruding downward (to light emitting element 131 side) from rear surface 143 at the outer periphery part of rear surface 143. Leg parts 146 support light flux controlling member 141 at an appropriate position with respect to light emitting element 131.

The light emitted from light emitting element 131 enters light flux controlling member 141 from incidence surface 142. At this time, with the shape of incidence surface 142, the light from light emitting element 131 (in particular, the light in a region around optical axis OA) is spread in a radial direction (a direction away from optical axis OA of light emitting element 131). The light having entered light flux controlling member 141 is emitted to the outside of emission surface 144. Also at this time, with the shape of emission surface 144, the light from light emitting element 131 is further spread in a radial direction (a direction away from optical axis OA of light emitting element 131). As a result, light-emitting device 130 emits light smoothly spread in a wide angle range.

Figure 6A:
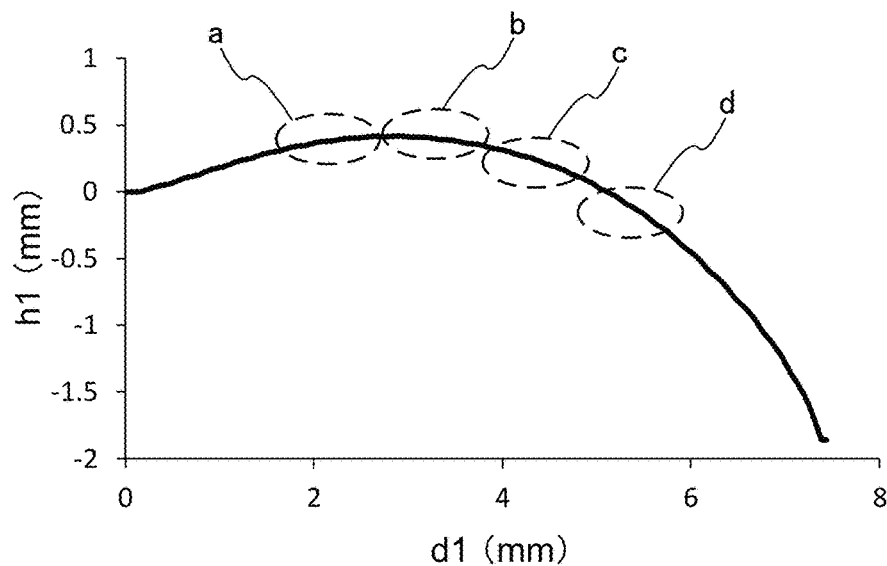
FIG. 6A is a graph showing a cross-sectional shape of the light flux controlling member according to the embodiment.
Figure 6B:
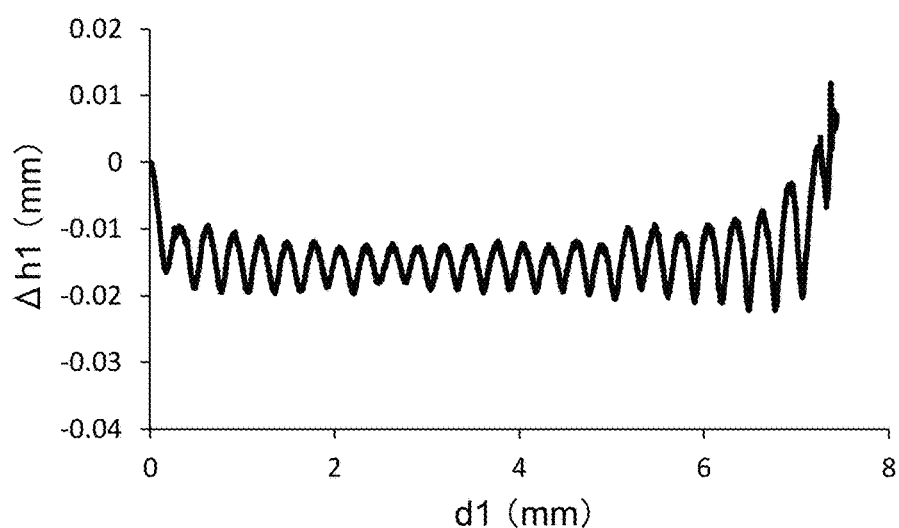
FIG. 6B is a graph obtained by subtracting a measurement result of a cross-sectional shape of a light flux controlling member of a comparative example from a measurement result of a cross-sectional shape of light flux controlling member shown in FIG. 6A.
Figure 7A:
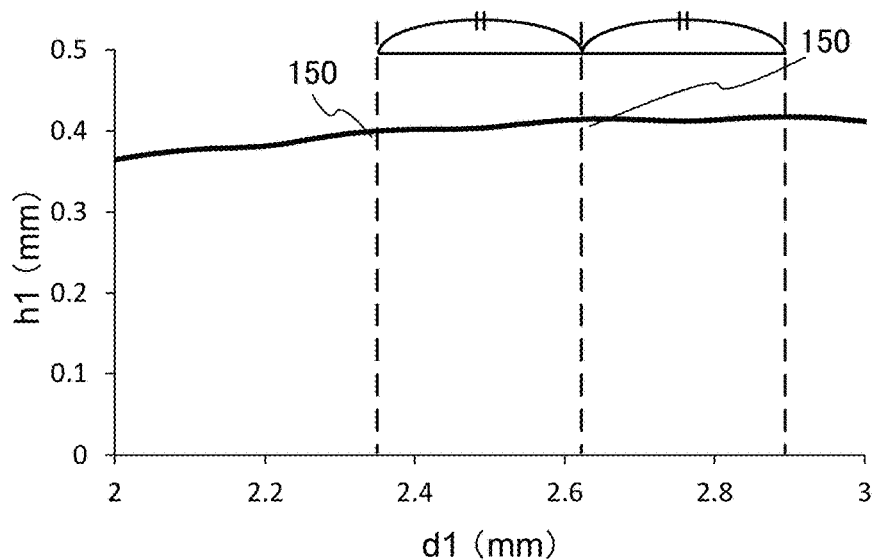
FIG. 7A and FIG. 7B are partially enlarged views of FIG. 6A.
Figure 7B:
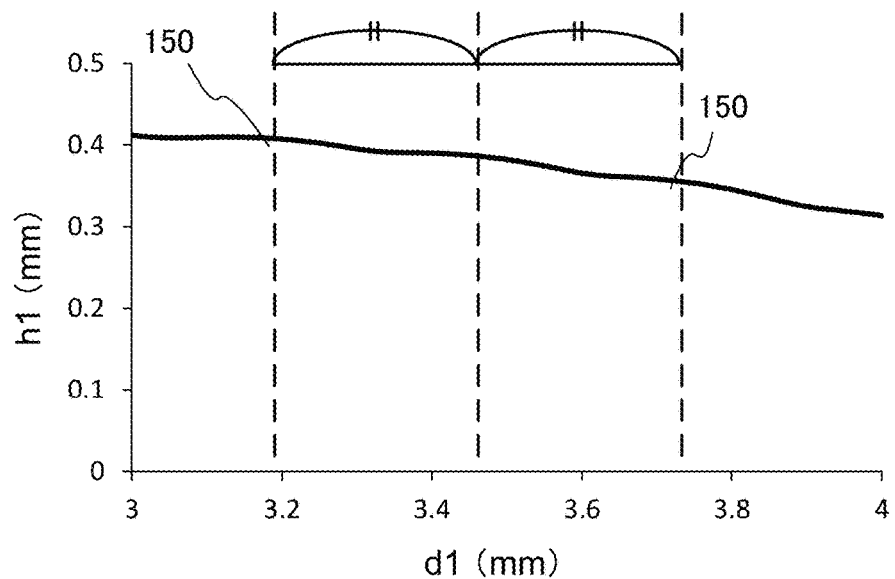
Figure 8A:
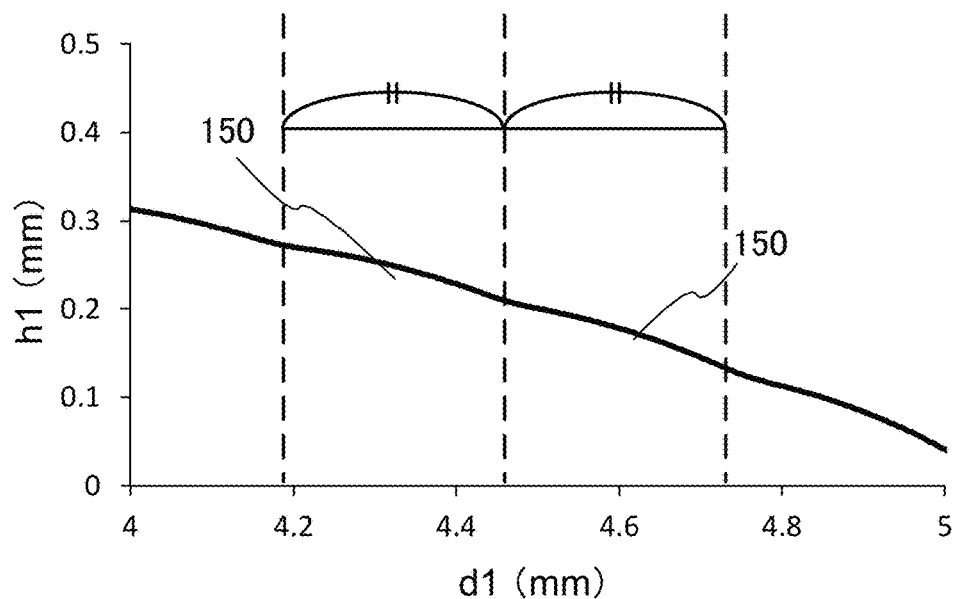
FIG. 8A and FIG. 8B are partially enlarged views of FIG. 6A.
Figure 8B:
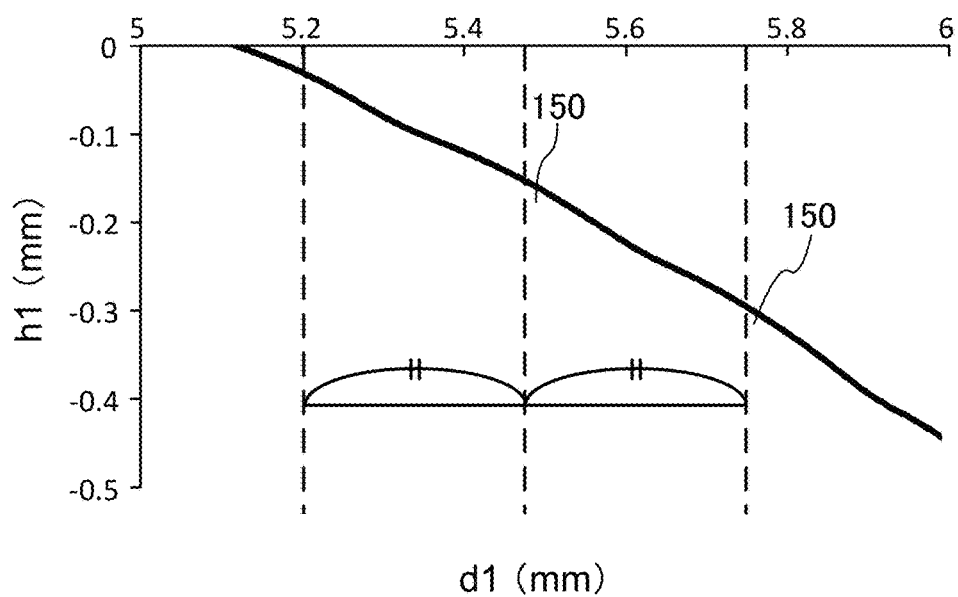

Now emission surface 144 is described in detail. FIG. 6A to FIG. 8B are graphs for describing emission surface 144. FIG. 6A shows a measurement result of a cross-sectional shape including central axis CA of light flux controlling member 141 according to the present embodiment. FIG. 6B shows a result obtained by subtracting a measurement result of a cross-sectional shape including central axis CA of a light flux controlling member of the comparative example provided with no protrusion 150 from a measurement result of a cross-sectional shape including central axis CA of light flux controlling member 141 according to the present embodiment provided with protrusion 150 (FIG. 6A). FIG. 7A is a partially enlarged view of region a of FIG. 6A, and FIG. 7B is a partially enlarged view of region b of FIG. 6A. FIG. 8A is a partially enlarged view of region c of FIG. 6A, and FIG. 8B is a partially enlarged view of region d of FIG. 6A. In FIG. 6A to FIG. 8B, the abscissa indicates a distance from central axis CA of light flux controlling member 141 (d1; mm). In FIG. 6A, FIG. 7A, FIG. 7B, FIG. 8A and FIG. 8B, the ordinate indicates a height with respect to the center of first emission surface 148 (h1; mm). In addition, in FIG. 6B, the ordinate indicates a result (Δh1; mm) obtained by subtracting a measurement result of a cross-sectional shape including central axis CA of the light flux controlling member of the comparative example provided with no protrusion 150 from a measurement result of a cross-sectional shape including central axis CA of light flux controlling member 141 according to the present embodiment (FIG. 6A). It is to be noted that, since emission surface 144 is formed to be rotationally symmetrical about central axis CA (optical axis OA), FIG. 6A to FIG. 8B show a result of only the right half of the cross section including central axis CA.

As described above, emission surface 144 includes a plurality of minute annular protrusions 150. That is, an annular recess is formed between two protrusions 150. Protrusion 150 and the annular recess are smoothly connected with each other, and protrusions 150 and the annular recess are visually recognized as waviness of emission surface 144 in external appearance. Protrusions 150 are formed at at least second emission surface 149. In the present embodiment, protrusions 150 are formed in the entirety of first emission surface 148 and second emission surface 149. In comparison with an emission surface on which no protrusion 150 is formed, the direction of light emission is slightly changed with emission surface 144 on which minute protrusions 150 which are visually recognized as waviness are formed. With this configuration, light subjected to color separation at emission surface 144 is moderately mixed together on the illuminated surface. On the other hand, cyclically formed minute protrusions 150 cyclically change the emission direction of light, which is different from scattering (a state where light reaching the minute range is dispersed all directions), and therefore, the light distribution characteristics of the entire light flux controlling member 141 is not substantially changed. As a result, color unevenness can be suppressed while achieving desired light distribution characteristics.

Minute annular protrusions 150 are concentrically disposed around central axis CA in first emission surface 148 and second emission surface 149. In addition, protrusions 150 disposed in first emission surface 148 and second emission surface 149 protrude in a direction along central axis CA. As illustrated in FIG. 6B and FIG. 7A to FIG. 8B, in plan view of first emission surface 148 and second emission surface 149, the pitch of protrusions 150 (the distance between vertices (ridgelines) of protrusions 150) is constant from the center portion of first emission surface 148 to the outer periphery portion of second emission surface 149. That is, in the cross section including central axis CA, the pitch of protrusions 150 in a direction perpendicular to central axis CA is constant. The pitch of protrusions 150 in a direction perpendicular to central axis CA is not limited, and is preferably 0.1 to 0.5 mm When the pitch of protrusions 150 is smaller than 0.1 mm, the angle variation of the emission surface in one protrusion 150 is excessively large, and consequently there is a risk that a desired light distribution cannot be achieved. On the other hand, when the pitch of protrusions 150 is greater than 0.5 mm, the angle variation of the emission surface in one protrusion 150 is excessively small, and consequently there is a risk that color unevenness cannot be sufficiently suppressed. In this manner, with protrusions 150 formed at a constant interval in a direction perpendicular to central axis CA in emission surface 144 (first emission surface 148 and second emission surface 149), the distribution of light emitted from emission surface 144 can be continuously (successively) changed, and color unevenness on light diffusion member 160 can be suppressed. In addition, with protrusion 150 protruding in a direction along central axis CA, an undercut portion is not formed, and manufacturing of a metal mold is facilitated.

The height of protrusion 150 is not limited, and is preferably 0.05 mm or smaller. When the height of protrusion 150 is greater than 0.05 mm, the angle variation of the emission surface in one protrusion 150 is excessively large, and consequently there is a risk that a desired light distribution cannot be achieved. It is to be noted that at a position in the radial direction in emission surface 144, the height of protrusion 150 may gradually decrease as the distance to central axis CA decreases (see the modification described later). That is, it suffices that protrusion 150 is formed only at a position where color unevenness is effectively suppressed. In addition, in the case where protrusion 150 is formed in first emission surface 148, it is preferable that the apex of protrusion 150 and central axis CA do not intersect each other so that the effect of spreading light in a region around optical axis OA is not impaired. Here, the "height of the protrusion" is the amplitude of waviness formed by the waveform, and the length corresponding to half the distance (interval in the direction parallel to central axis CA passing through the vertex of the protrusion) between the straight line connecting the vertices of the adjacent two protrusions 150, and the straight line connecting the recess between the two protrusions 150 and the valley bottoms of two recesses on the both sides of the recess, in the cross section including central axis CA.

[Experiment 1]

In Experiment 1, four light flux controlling members 141 which are different from each other in designed pitch of protrusion 150 and/or height of protrusion 150 in the cross section including central axis CA were observed, and the Y-chromaticity value and the luminance distribution on light diffusion member 160 were measured in surface light source devices 100 using respective light flux controlling members A to E. Experiment 1 used a light flux controlling member having a pitch of 0.288 mm and a height of 0.015 mm (hereinafter referred to also as "light flux controlling member A"), a light flux controlling member having a pitch of 0.288 mm and a height of 0.030 mm (hereinafter referred to also as "light flux controlling member B"), a light flux controlling member having a pitch of 0.192 mm and a height of 0.015 mm (hereinafter referred to also as "light flux controlling member C"), and a light flux controlling member having a pitch of 0.192 mm and a height of 0.030 mm (hereinafter referred to also as "light flux controlling member D") (the above-mentioned numerical values are designed values). Further, for comparison, a light flux controlling member provided with no protrusion 150 (pitch 0 mm and height 0 mm) (hereinafter referred to also as "light flux controlling member E") was also used in the measurement.

Figure 9A:
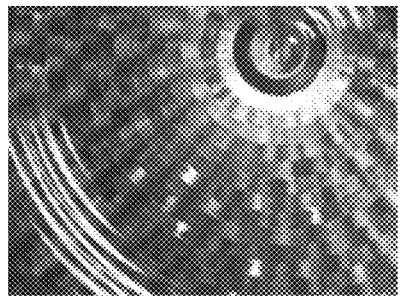
FIG. 9A to FIG. 9F are photographs of emission surfaces of light flux controlling members A to F.
Figure 9D:
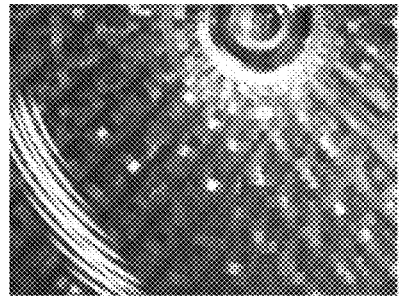
Figure 9B:
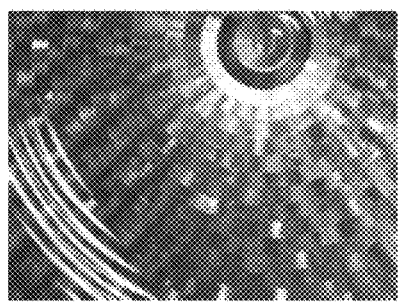
Figure 9E:
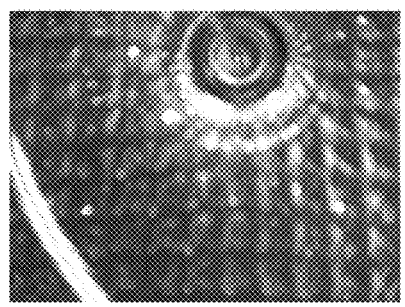
Figure 9C:
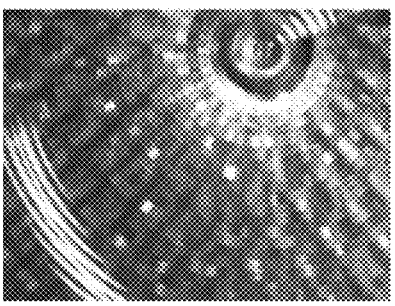
Figure 9F:
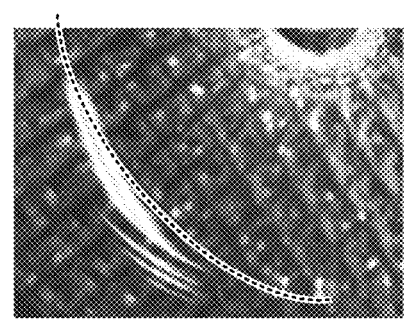

First, the external shapes of light flux controlling members A to E were observed. In addition, a light flux controlling member in which protrusion 150 is formed only in second emission surface 149 was produced, and the emission surface was observed. FIG. 9A is a photograph of the emission surface of light flux controlling member A, FIG. 9B is a photograph of the emission surface of light flux controlling member B, FIG. 9C is a photograph of the emission surface of light flux controlling member C, FIG. 9D is a photograph of the emission surface of light flux controlling member D, FIG. 9E is a photograph of the emission surface of light flux controlling member E, and FIG. 9F is a photograph of the emission surface of the light flux controlling member in which protrusion 150 is formed only in second emission surface 149. In the photographs, protrusions 150 can be visually recognized at a portion where illuminating light is reflected (lower left portion).

As illustrated in FIG. 9A to FIG. 9E, in the produced light flux controlling members A to E, protrusions 150 formed in emission surface 144 were observed as thin lines. In addition, as illustrated in FIG. 9F, with the broken line as the boundary, presence/absence of protrusion 150 was observed.

Figure 10A:
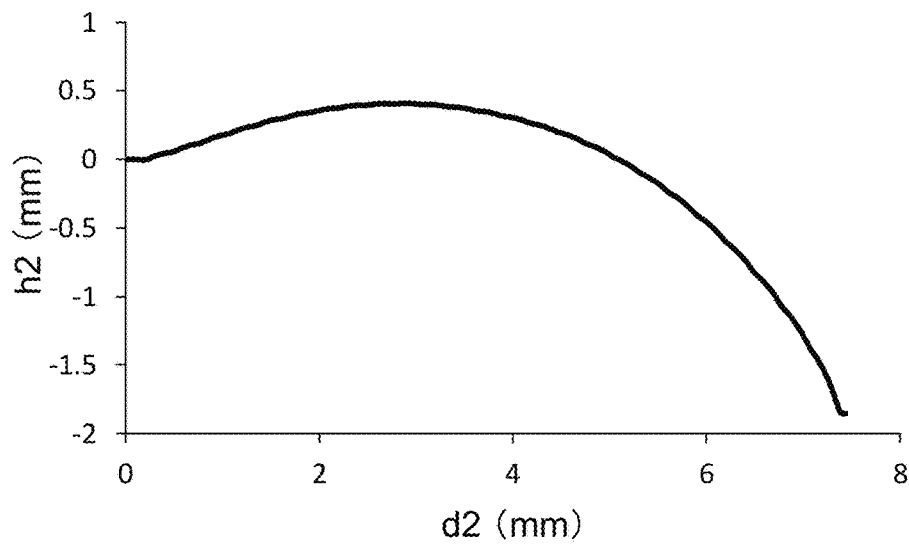
FIG. 10A is a graph showing a cross-sectional shape of light flux controlling member A according to the embodiment.
Figure 10B:
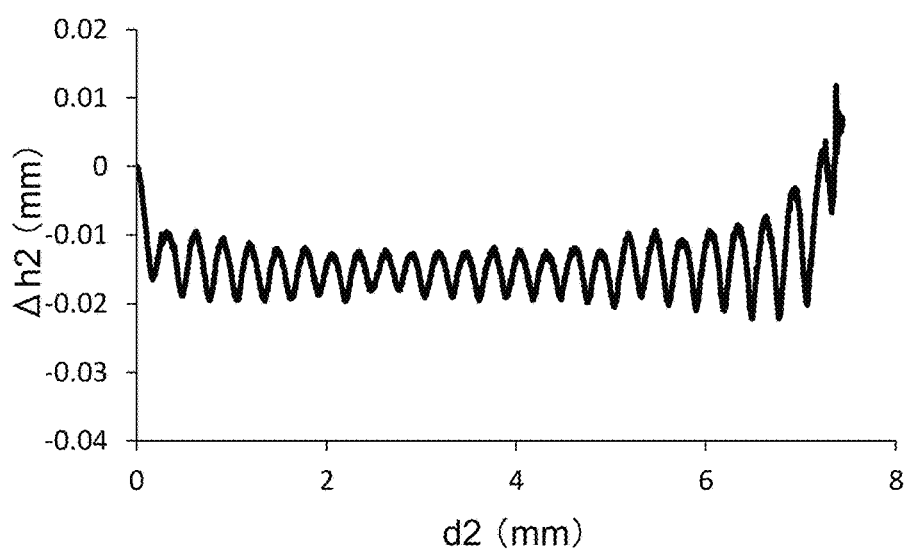
FIG. 10B is a graph obtained by subtracting a measurement result of a cross-sectional shape of light flux controlling member E of the comparative example from a measurement result of the cross-sectional shape of light flux controlling member A.
Figure 11A:
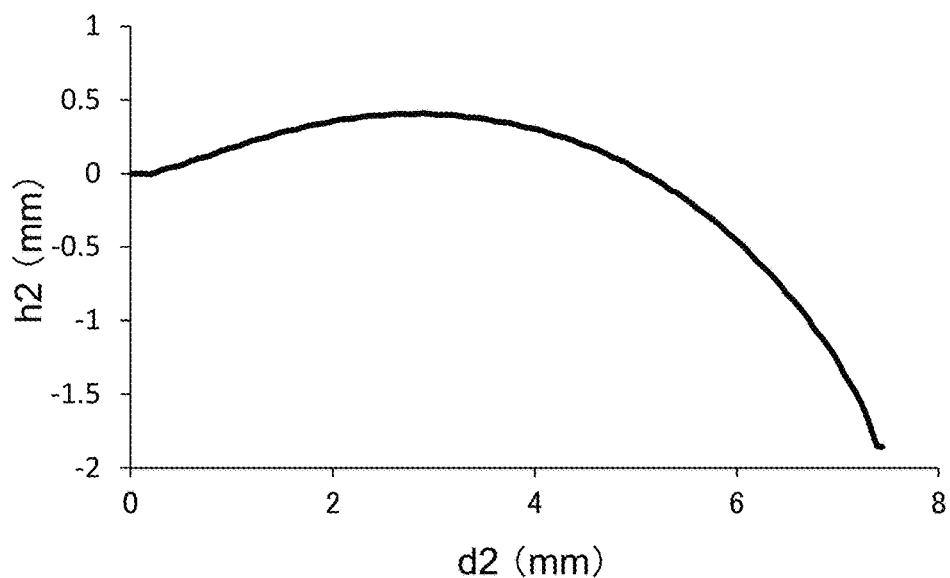
FIG. 11A is a graph showing a cross-sectional shape of light flux controlling member B according to the embodiment.
Figure 11B:
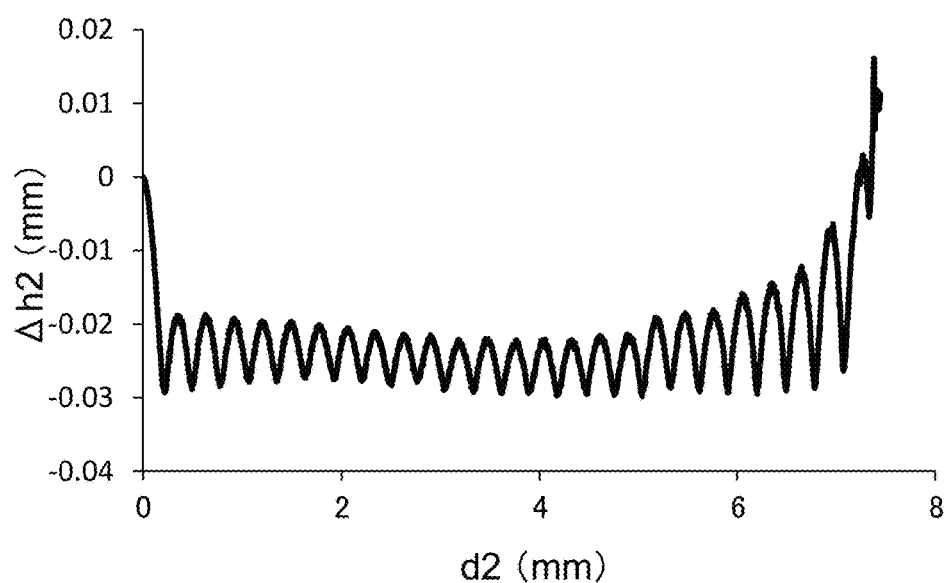
FIG. 11B is a graph obtained by subtracting a measurement result of the cross-sectional shape of light flux controlling member E of the comparative example from a measurement result of the cross-sectional shape of light flux controlling member B.
Figure 12A:
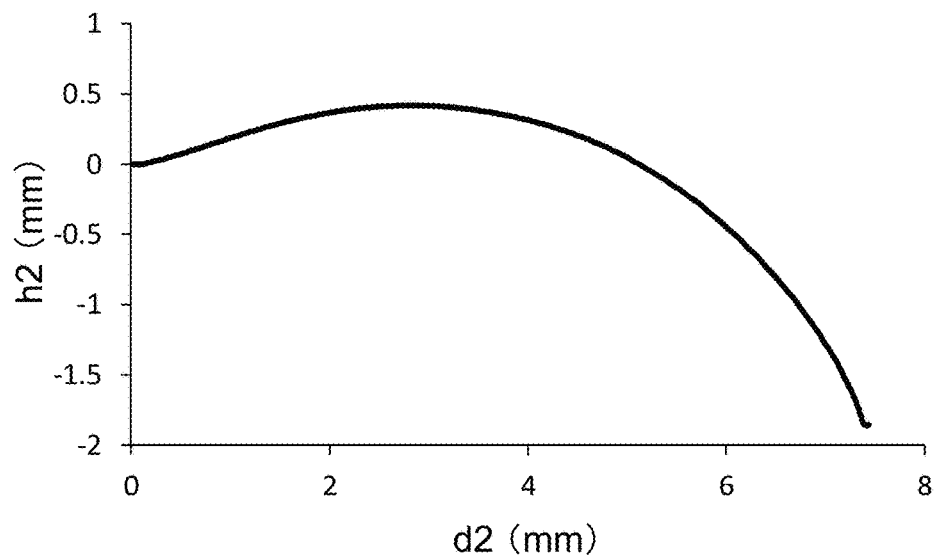
FIG. 12A is a graph showing a cross-sectional shape of light flux controlling member C according to the embodiment.
Figure 12B:
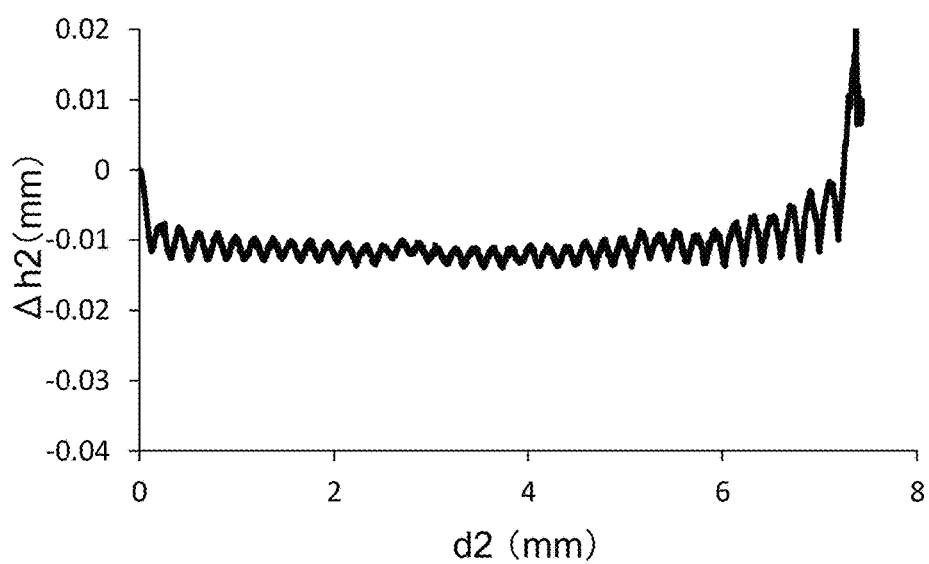
FIG. 12B is a graph obtained by subtracting a measurement result of the cross-sectional shape of light flux controlling member E of the comparative example from a measurement result of the cross-sectional shape of light flux controlling member C.
Figure 13A:
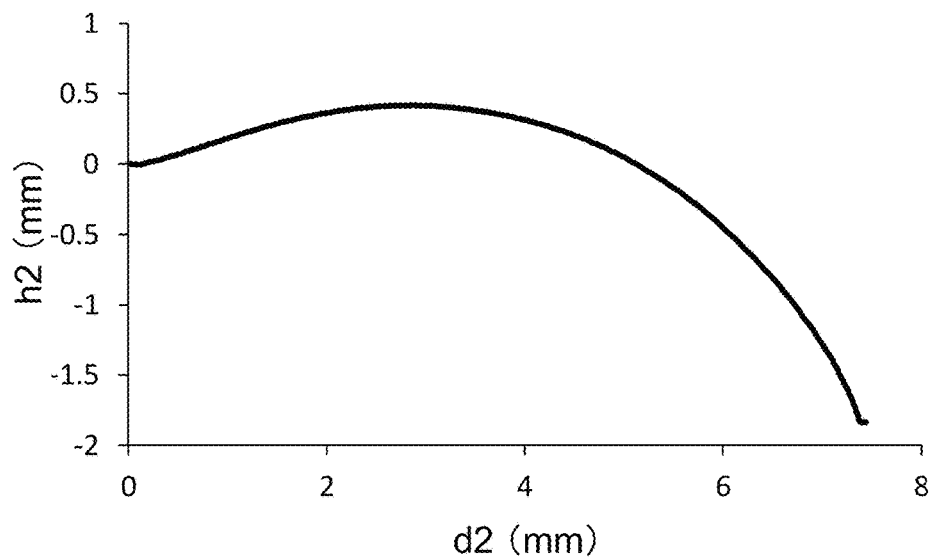
FIG. 13A is a graph showing a cross-sectional shape of light flux controlling member D according to the embodiment.
Figure 13B:
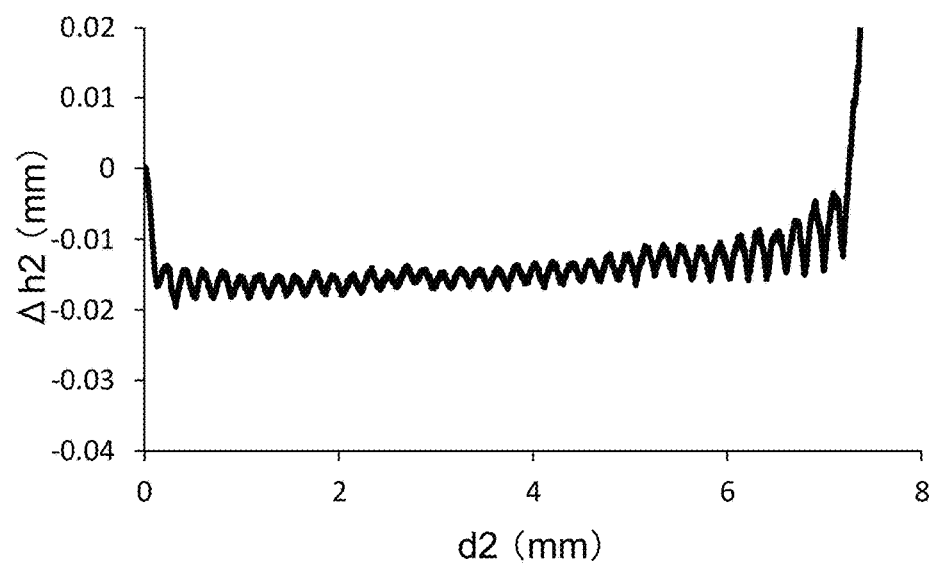
FIG. 13B is a graph obtained by subtracting a measurement result of the cross-sectional shape of light flux controlling member E of the comparative example from a measurement result of the cross-sectional shape of light flux controlling member D.

Next, in the cross section including central axis CA, the shapes of emission surfaces 144 of light flux controlling members A to E were measured. FIG. 10A shows a measurement result of a cross-sectional shape including central axis CA of the emission surface of light flux controlling member A, and FIG. 10B shows a difference in shape of the emission surfaces of light flux controlling member A and light flux controlling member E. FIG. 11A shows a measurement result of a cross-sectional shape including central axis CA of the emission surface of light flux controlling member B, and FIG. 11B shows a difference in shape of the emission surfaces of light flux controlling member B and light flux controlling member E. FIG. 12A shows a measurement result of a cross-sectional shape including central axis CA of the emission surface of light flux controlling member C, and FIG. 12B shows a difference in shape of the emission surfaces of light flux controlling member C and light flux controlling member E. FIG. 13A shows a measurement result of a cross-sectional shape including central axis CA of the emission surface of light flux controlling member D, and FIG. 13B shows a difference in shape of the emission surfaces of light flux controlling member D and light flux controlling member E. In FIG. 10A to 13B, the abscissa indicates a distance from central axis CA of light flux controlling member 141 (d2; mm). In FIG. 10A, FIG. 11A, FIG. 12A and FIG. 13A, the ordinate indicates the height with respect to the center of first emission surface 148 (h2; mm). In FIG. 10B, FIG. 11B, FIG. 12B and FIG. 13B, the ordinate indicates the difference in shape of the emission surfaces of each of light flux controlling members A to D, and light flux controlling member E ($\Delta$h2; mm). As illustrated in FIG. 10A to FIG. 13B (light flux controlling member E is not illustrated), five light flux controlling members A to E which are different from each other in pitch and height in the cross section including central axis CA were prepared. The measurement results show the fact that the heights corresponding to the designed values were not obtained due to working problems.

FIG. 14A to FIG. 18C are graphs showing the distance from the center of light flux controlling member, and a measurement result of the luminance distribution or the Y-chromaticity value. The measurement of the Y-chromaticity value and the luminance distribution was performed using surface light source device 100 provided with only one light-emitting device 130. It is to be noted that, in surface light source device 100 used in the measurement, the distance between substrate 120 and light diffusion member 160 was set to 24 mm.

Figure 14A:
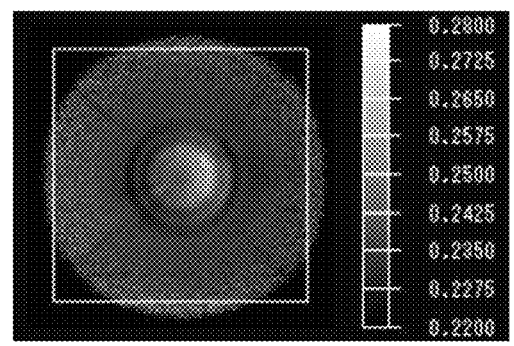
FIG. 14A is a graph showing a luminance on a light diffusion member in the case where light flux controlling member A is used.
Figure 14B:
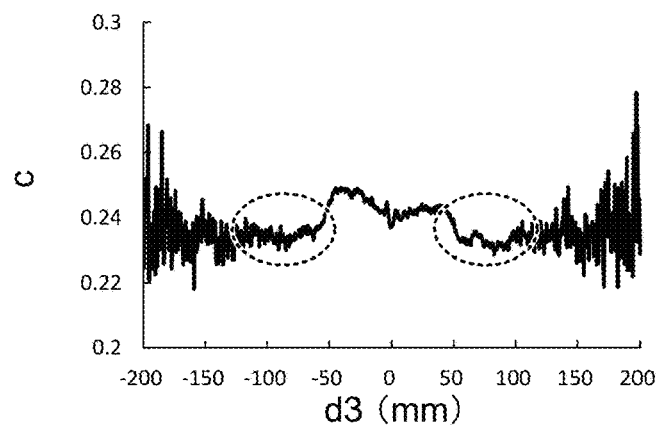
FIG. 14B is a graph showing a chromaticity on the light diffusion member in the case where light flux controlling member A is used.
Figure 14C:
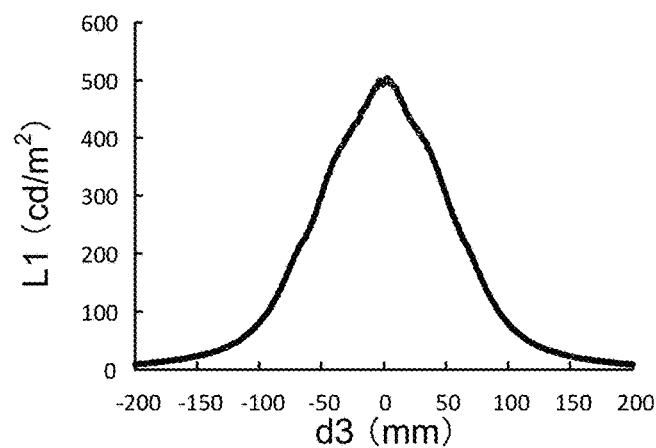
FIG. 14C is a graph showing a luminance on the light diffusion member in the case where light flux controlling member A is used.
Figure 15A:
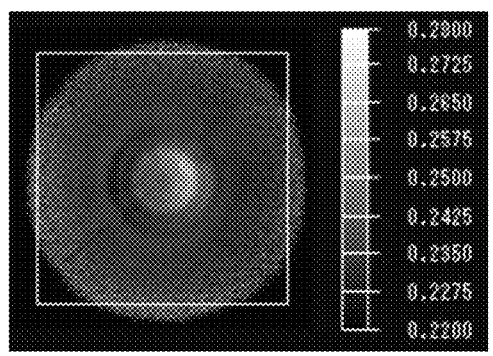
FIG. 15A is a graph showing a luminance on the light diffusion member in the case where light flux controlling member B is used.
Figure 15B:
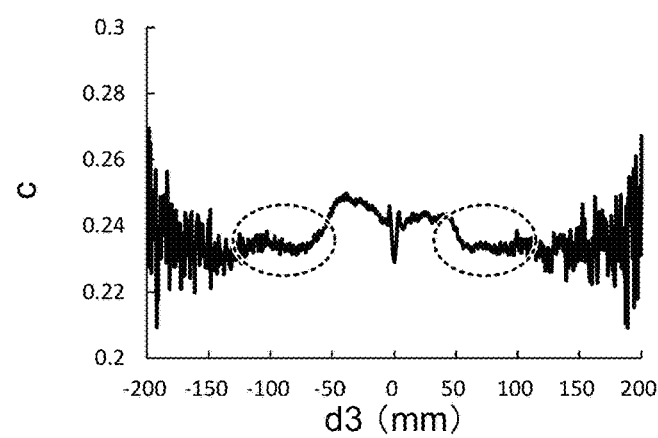
FIG. 15B is a graph showing a chromaticity on the light diffusion member in the case where light flux controlling member B is used.
Figure 15C:
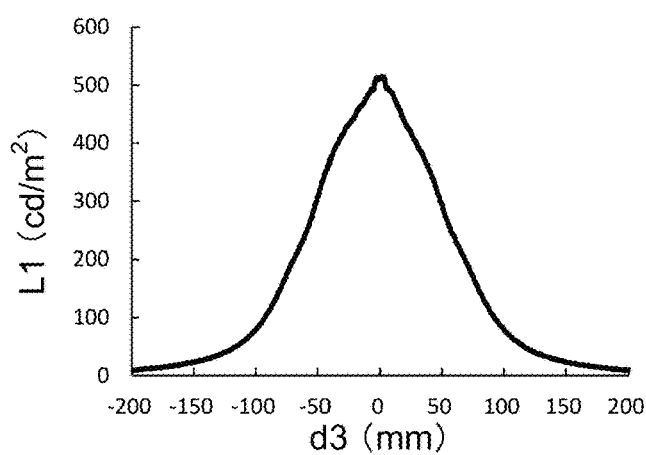
FIG. 15C is a graph showing a luminance on the light diffusion member in the case where light flux controlling member B is used.
Figure 16A:
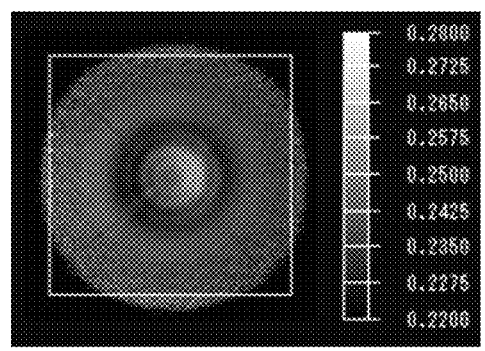
FIG. 16A is a graph showing a luminance on the light diffusion member in the case where light flux controlling member C is used.
Figure 16B:
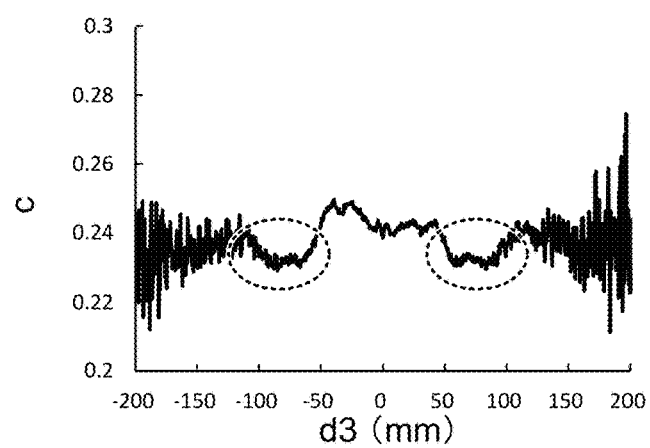
FIG. 16B is a graph showing a chromaticity on the light diffusion member in the case where light flux controlling member C is used.
Figure 16C:
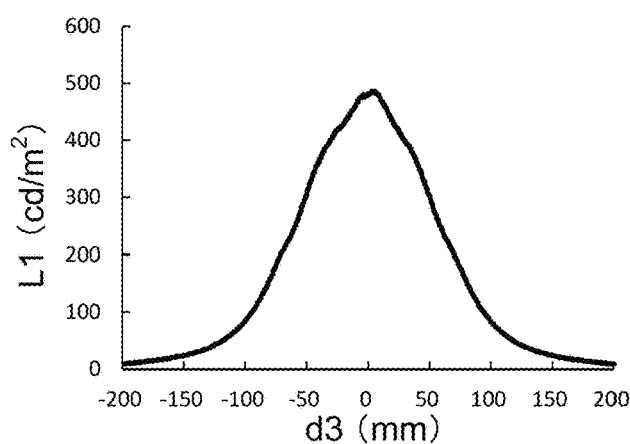
FIG. 16C is a graph showing a luminance on the light diffusion member in the case where light flux controlling member C is used.
Figure 17A:
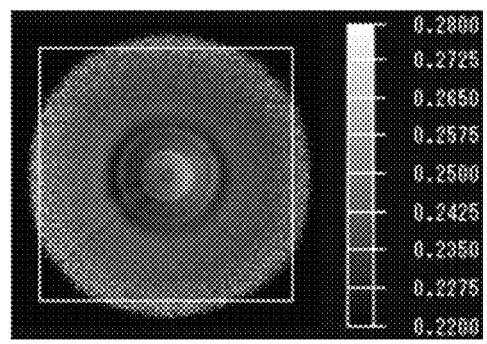
FIG. 17A is a graph showing a luminance on the light diffusion member in the case where light flux controlling member D is used.
Figure 17B:
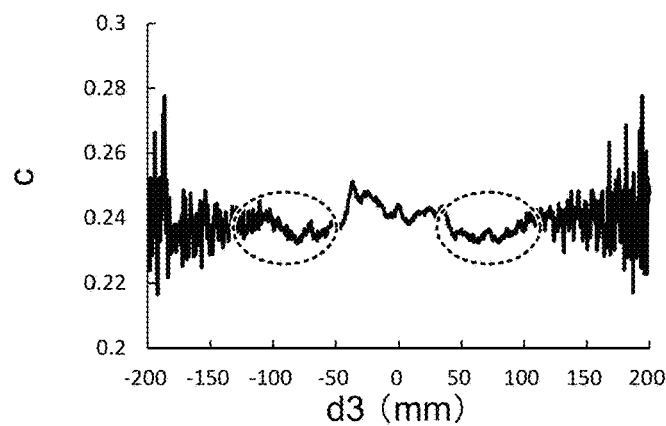
FIG. 17B is a graph showing a chromaticity on the light diffusion member in the case where light flux controlling member D is used.
Figure 17C:
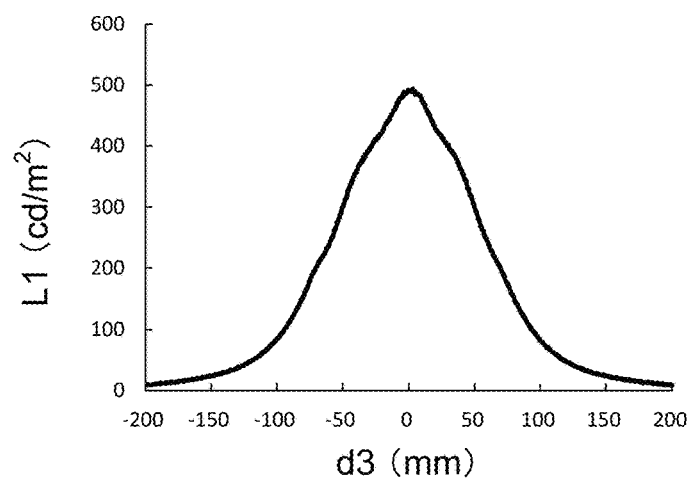
FIG. 17C is a graph showing a luminance on the light diffusion member in the case where light flux controlling member D is used.
Figure 18A:
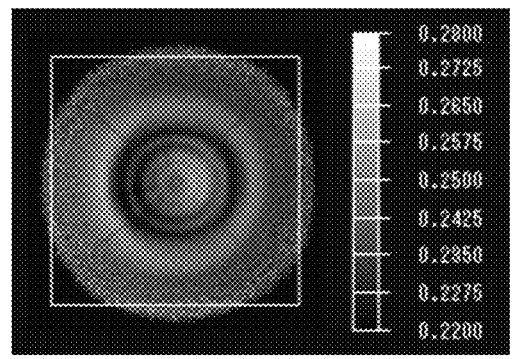
FIG. 18A is a graph showing a luminance on the light diffusion member in the case where light flux controlling member E is used.
Figure 18B:
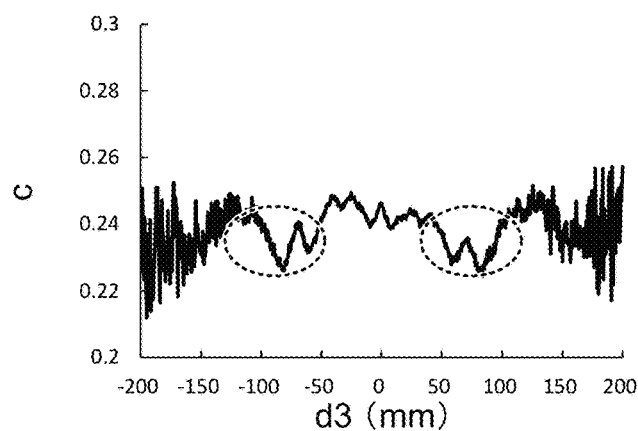
FIG. 18B is a graph showing a chromaticity on the light diffusion member in the case where light flux controlling member E is used.
Figure 18C:
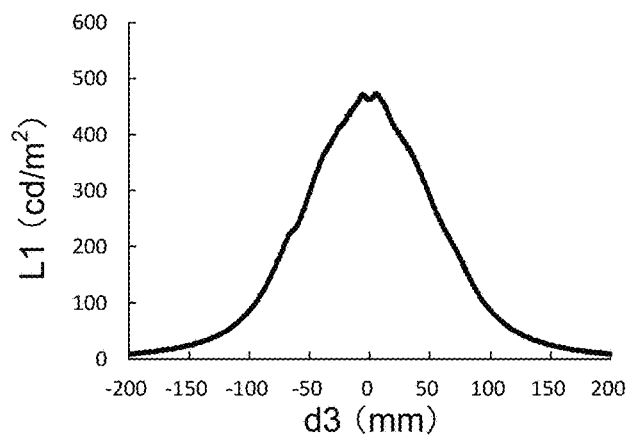
FIG. 18C is a graph showing a luminance on the light diffusion member in the case where light flux controlling member E is used.

FIG. 14A shows a luminance distribution on light diffusion member 160 in the case where light flux controlling member A was used, FIG. 14B is a graph showing a relationship between a distance from central axis CA of light flux controlling member A (mm), and a Y-chromaticity value on light diffusion member 160, and FIG. 14C is a graph showing a relationship between a distance (mm) from central axis CA of light flux controlling member A, and a luminance (cd/m$^2$) on light diffusion member 160. FIG. 15A shows a luminance distribution on light diffusion member 160 in the case where light flux controlling member B was used, FIG. 15B shows a graph showing a relationship between a distance (mm) from central axis CA of light flux controlling member B, and a Y-chromaticity value on light diffusion member 160, and FIG. 15C is a graph showing a relationship between a distance (mm) from central axis CA of light flux controlling member B, and a luminance (cd/m$^2$) on light diffusion member 160. FIG. 16A shows a luminance distribution on light diffusion member 160 in the case where light flux controlling member C was used, FIG. 16B a graph showing a relationship between is a distance (mm) from central axis CA of light flux controlling member C, and a Y-chromaticity value on light diffusion member 160, and FIG. 16C is a graph showing a relationship between a distance (mm) from central axis CA of light flux controlling member C, and a luminance (cd/m$^2$) on light diffusion member 160. FIG. 17A shows a luminance distribution on light diffusion member 160 in the case where light flux controlling member D was used, FIG. 17B is a graph showing a relationship between a distance (mm) from central axis CA of light flux controlling member D, and a Y-chromaticity value on light diffusion member 160, and FIG. 17C is a graph showing a relationship between a distance (mm) from central axis CA of light flux controlling member D, and a luminance (cd/m$^2$) on light diffusion member 160. FIG. 18A shows a luminance distribution on light diffusion member 160 in the case where light flux controlling member E was used, FIG. 18B is a graph showing a relationship between a distance (mm) from central axis CA of light flux controlling member E, and a Y-chromaticity value on light diffusion member 160, and FIG. 18C is a graph showing a relationship between a distance (mm) from central axis CA of light flux controlling member E, and a luminance (cd/m$^2$) on light diffusion member 160. In FIGS. 13B and 13C to FIGS. 17B and 17C, the abscissa indicates a distance (d3; mm) from central axis CA of light flux controlling member 141 on light diffusion member 160. In addition, in FIG. 14B, FIG. 15B, FIG. 16B, FIG. 17B and FIG. 18B, the ordinate indicates a Y-chromaticity value on light diffusion member 160 (c). In FIG. 14C, FIG. 15C, FIG. 16C, FIG. 17C and FIG. 18C, the ordinate indicates a luminance (L1; cd/m$^2$) on light diffusion member 160.

As indicated with the broken lines in FIG. 14B, FIG. 15B, FIG. 16B, FIG. 17B, and FIG. 18B, in the case where light flux controlling members A to D according to the present embodiment were used, color contrast was reduced, and color unevenness was eliminated. In particular, color contrast was significantly reduced, and color unevenness was significantly eliminated in the configuration in which the pitch of protrusions 150 is set to a large value (light flux controlling member A and B) in comparison with the configuration in which the pitch of protrusions 150 is set to a small value. From a study in light of the measurement results shown in FIG. 10B, FIG. 11B, FIG. 12B and FIG. 13B, the effect of the pitch cannot be confirmed by comparison between configurations having the same actual height of protrusion 150. The reason that light flux controlling member B achieves the effect of reducing color unevenness in comparison with light flux controlling member D may possibly be not by the difference in pitch, but by the difference in height of protrusion 150 in the actual product. However, with the actual pitch and height of protrusion 150 in light flux controlling members A to D according to the present embodiment, the effect of reducing color unevenness was confirmed. It is to be noted that, although not illustrated in the drawings, even with a light flux controlling member in which protrusions 150 having a low height are formed at a small pitch only in second emission surface 149, color contrast was reduced, and color unevenness was eliminated. Further, as can be understood from comparison among FIGS. 14A to FIG. 17C and FIGS. 18A to 18C, even with light flux controlling members A to D according to the present embodiment, a luminance distribution similar to that of light flux controlling member E of the comparative example was obtained.

[Effect]

Light flux controlling member 141 according to the present embodiment is provided with a plurality of minute annular protrusions 150 formed in emission surface 144 at a constant pitch in a direction perpendicular to central axis CA and protruded in a direction along central axis CA, and therefore can eliminate color unevenness by slightly changing the emission direction of the light emitted from light emitting element 131 while spreading the light as with a light flux controlling member provided with no protrusion 150. In addition, since light flux controlling member 141 according to the present embodiment is provided with no undercut portion, a metal mold for manufacturing light flux controlling member 141 can be readily produced.

On the other hand, when a light diffusion treatment is performed on emission surface 53 in lens 50 (light flux controlling member) disclosed in PTL 1, light emitted from emission surface 53 is scattered in all directions. At this time, regarding light travelling in a lateral direction from emission surface 53, the distance to light diffusion member 30 is long, and has only a small influence on color unevenness in light diffusion member 30 of light-emitting device 20. On the other hand, regarding light travelling directly upward from emission surface 53, the distance to light diffusion member 30 is short, and has a large influence on color unevenness in light diffusion member 30 of light-emitting device 20. That is, even when a light diffusion treatment is performed on emission surface 53, lens 50 disclosed in PTL 1 causes color unevenness on light diffusion member 30 of light-emitting device 20. In addition, when it is assumed that emission surface 53 has a spherical surface or an aspherical surface as in the present invention, a light diffusion treatment cannot be uniformly performed even when a blast process is performed in a direction along central axis CA.

In addition, when incidence surface 51 or reflecting surface 52 is subjected to a light diffusion treatment in lens 50 disclosed in PTL 1, an undercut portion is formed, and the structure of lens 50 for manufacturing a metal mold is complicated.

[Modification]

Next, a light flux controlling member according to a modification of the present embodiment is described. The light flux controlling member according to the modification is different from light flux controlling member 141 according to the embodiment in that the height of the protrusion decreases as the distance to central axis CA decreases. In view of this, the components same as those of light flux controlling member 141 according to the present embodiment are denoted with the same reference numerals, and description thereof is omitted, and only components different from those of light flux controlling member 141 according to the present embodiment are described.

Figure 19A:
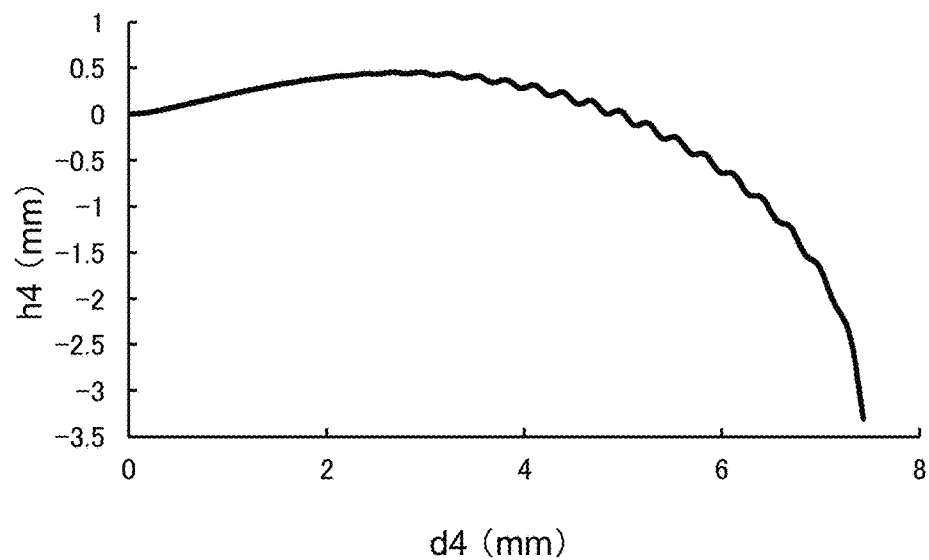
FIG. 19A is a graph showing a cross-sectional shape of a light flux controlling member according to a modification of the embodiment.
Figure 19B:
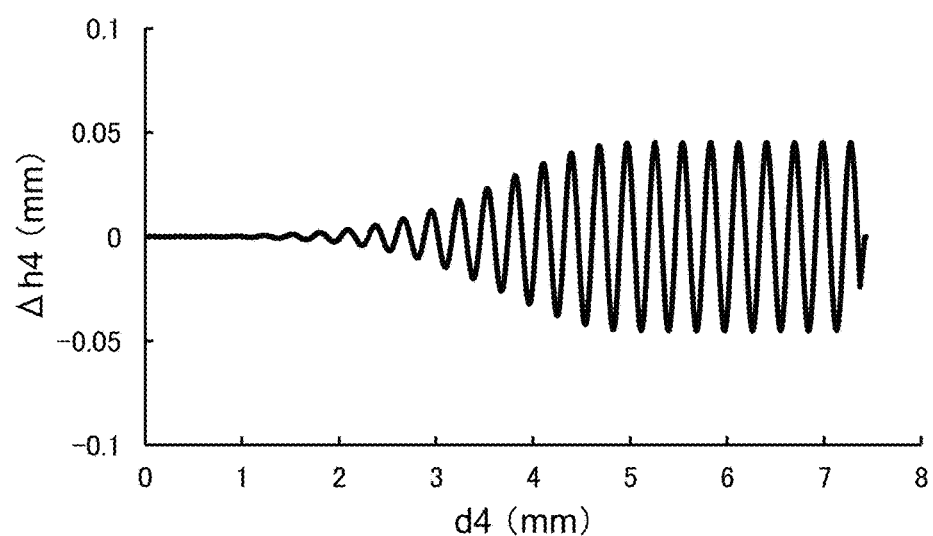
FIG. 19B is a graph obtained by subtracting a designed value of a cross-sectional shape of light flux controlling member E of the comparative example from a designed value of a cross-sectional shape of the light flux controlling member shown in FIG. 19A.

FIG. 19A and FIG. 19B are graphs for describing a shape of an emission surface of the light flux controlling member according to the modification. FIG. 19A shows a designed value of a cross-sectional shape including central axis CA of the light flux controlling member according to the modification of the present embodiment. FIG. 19B shows a result obtained by subtracting a designed value of a cross-sectional shape including central axis CA of light flux controlling member E of the comparative example provided with no protrusion 150 from a designed value of a cross-sectional shape including central axis CA of the light flux controlling member according to the modification of the present embodiment provided with protrusion 150 (FIG. 19A). In FIG. 19A and FIG. 19B, the abscissa indicates a distance from central axis CA of the light flux controlling member (d4; mm). In FIG. 19A, the ordinate indicates a height with respect to the center of the first emission surface (h4; mm). In addition, in FIG. 19B, the ordinate indicates a difference between a designed value of the emission surface of the light flux controlling member according to the modification of the present embodiment and a designed value of the emission surface of light flux controlling member E of the comparative example (Δh4; mm). It is to be noted that, since the emission surface is formed to be rotationally symmetrical about central axis CA (optical axis OA), FIG. 19A shows a result of only the right half of the cross section including central axis CA.

The emission surface of the light flux controlling member according to the modification includes a first emission surface and a second emission surface. The first emission surface and the second emission surface include a plurality of minute annular protrusions. That is, an annular recess is formed between two annular protrusions. The protrusions and recesses are smoothly connected with each other, and are visually recognized as waviness of the emission surface in external appearance. In the cross section including central axis CA, the protrusions of the first emission surface and the protrusions of the second emission surface have a wavy shape.

The height of each protrusion decreases toward central axis CA from the external edge of the second emission surface. The degree of the reduction in height of the protrusion is not limited. The height of the protrusion may be reduced in a uniform manner, or may be reduced such that the reduction length is gradually increased, or, may be reduced such that the reduction length is gradually reduced. In addition, the reduction length of the height of the protrusion may be reduced after it is increased. In the present embodiment, the reduction length of the height of the protrusion is small on the external edge side of the second emission surface, and is reduced after being increased toward the central axis. Here, the reduction length is a difference between the height of a certain protrusion and the height of another protrusion internally adjacent to the certain protrusion. It is to be noted that, preferably, at a position where the first emission surface intersects central axis CA, the height of the protrusion is 0. That is, preferably, the first emission surface and central axis CA perpendicularly intersect each other.

[Experiment 2]

In experiment 2, in a surface light source device using light flux controlling member F according to the modification in which the height of the protrusions decreases from the external edge toward the center portion of the second emission surface, a Y-chromaticity value and a luminance distribution on light diffusion member 160 were measured.

Figure 20A:
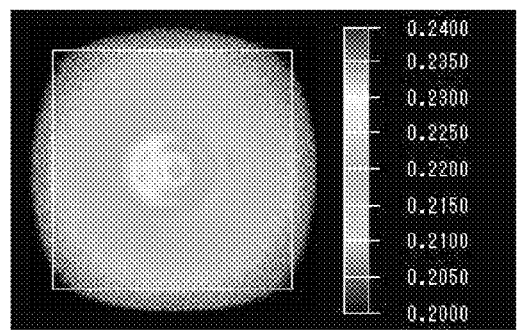
FIG. 20A is a graph showing a luminance on the light diffusion member in the case where light flux controlling member F is used.
Figure 20B:
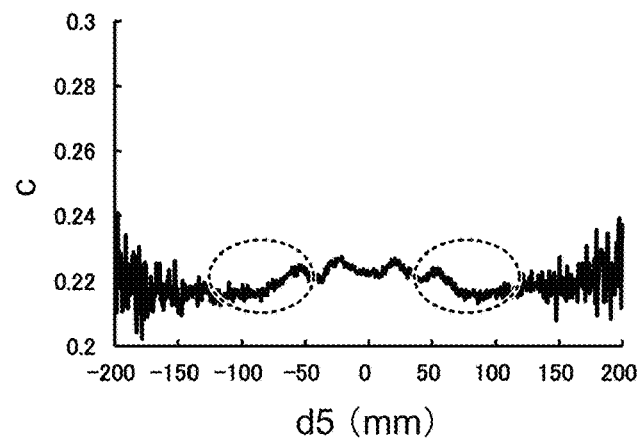
FIG. 20B is a graph showing a chromaticity on the light diffusion member in the case where light flux controlling member F is used.
Figure 20C:
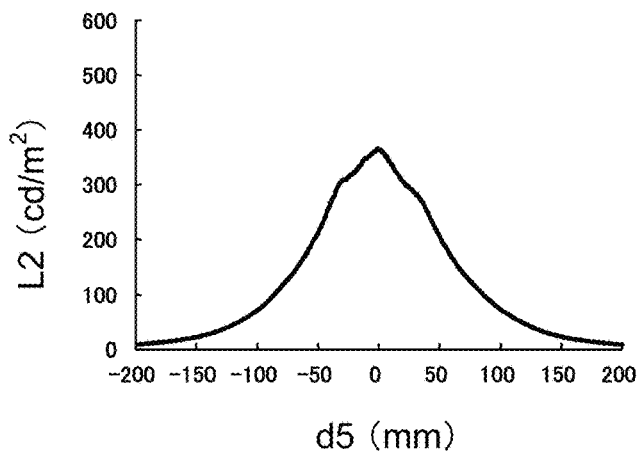
FIG. 20C is a graph showing a luminance on the light diffusion member in the case where light flux controlling member F is used.

FIG. 20A to FIG. 20C are graphs showing a distance from the center of light flux controlling member F, and a measurement result of a luminance distribution or a Y-chromaticity value. The measurement of the Y-chromaticity value and the luminance distribution was performed with use of a surface light source device including only one light-emitting device. It is to be noted that, in the surface light source device used for the measurement, the distance between substrate 120 and light diffusion member 160 was set to 24 mm. It is to be noted that the reduction length of the height of the protrusions is set to be reduced after being increased from the external edge of the second emission surface side toward the central axis (see FIG. 19B).

FIG. 20A shows a luminance distribution on light diffusion member 160 in the case where light flux controlling member F is used, FIG. 20B is a graph showing a relationship between a distance (mm) from central axis CA of light flux controlling member F and a Y-chromaticity value on light diffusion member 160, and FIG. 20C is a graph showing a relationship between a distance (mm) from central axis CA of light flux controlling member F and a luminance ($cd/m^2$) on light diffusion member 160. In FIG. 20B and FIG. 20C, the abscissa indicates the distance from central axis CA of the light flux controlling member (d5; mm). In FIG. 20B, the ordinate indicates a Y-chromaticity value (c) on light diffusion member 160. In addition, in FIG. 20C, the ordinate indicates a luminance (L2; $cd/m^2$) on light diffusion member 160.

As indicated with the broken line in FIG. 20B, in the case where light flux controlling member F according to the modification of the present embodiment is used, color contrast was reduced, and color unevenness was further eliminated in comparison with the case where the light flux controlling member 141 according to the embodiment is used. In addition, as can be understood from comparison between FIGS. 18A to 18C and FIGS. 20A to 20C, also with light flux controlling member F according to the modification of the present embodiment, a luminance distribution similar to that of light flux controlling member E of the comparative example was obtained.

This application is entitled to and claims the benefit of Japanese Patent Application No. 2014-175671 filed on Aug. 29, 2014, and Japanese Patent Application No. 2015-059483 filed on Mar. 23, 2015 the disclosure each of which including the specification, drawings and abstract is incorporated herein by reference in its entirety.

INDUSTRIAL APPLICABILITY

A surface light source device including the light flux controlling member according to the embodiment of the present invention is applicable to a backlight of a liquid crystal display, a sign board, a generally-used illumination apparatus and the like, for example.

REFERENCE SIGNS LIST

10 Surface light source device
20 Light-emitting device
30 Light diffusion member
40 Light emitting element
50 Lens
51 Incidence surface
52 Reflecting surface
53 Emission surface
100 Surface light source device
110 Casing
120 Substrate
130 Light-emitting device
131 Light emitting element
141 Light flux controlling member
142 Incidence surface
143 Rear surface
144 Emission surface
145 Flange part
146 Leg part
147 First recess
148 First emission surface
149 Second emission surface
150 Protrusion
160 Light diffusion member
CA Central axis of light flux controlling member
OA Optical axis of light emitting element

The invention claimed is:

1. A light flux controlling member disposed such that an optical axis of light emitted from a light emitting element and a central axis of the light flux controlling member coincide with each other, the light flux controlling member being configured to control a distribution of the light emitted from the light emitting element, comprising:
   an incidence surface composed of an internal surface of a first recess and configured to allow incidence of the light emitted from the light emitting element, the first recess being disposed on the light emitting element side to intersect the central axis; and
   an emission surface disposed on a side opposite to the incidence surface to intersect the central axis, and configured to emit light incident on the incidence surface to outside of the light flux controlling member, wherein:
   the emission surface includes:
      a first emission surface composed of an internal surface of a second recess disposed to intersect the central axis, and
      a second emission surface composed of a protruding curved surface disposed to surround the first emission surface,
   the second emission surface includes a plurality of annular protrusions concentrically disposed around the central axis and protruded in a direction along the central axis,
   a pitch of the plurality of annular protrusions in a direction perpendicular to the central axis is constant in a cross section including the central axis, and
   heights of the plurality of annular protrusions of the second emission surface, or a plurality of annular protrusions of the first emission surface and the plurality of annular protrusions of the second emission surface decrease toward the central axis from an external edge of the second emission surface.

2. The light flux controlling member according to claim 1, wherein in the cross section including the central axis, the pitch of the plurality of annular protrusions in the direction perpendicular to the central axis falls within a range of 0.1 to 0.5 mm, and a height of each protrusion is 0.05 mm or smaller.

3. The light flux controlling member according to claim 1, wherein:
   the first emission surface includes the plurality of annular protrusions concentrically disposed around the central axis and protruded in a direction along the central axis, and
   a pitch of the plurality of annular protrusions of the first emission surface and the plurality of annular protrusions of the second emission surface in the direction perpendicular to the central axis is constant in the cross section including the central axis.

4. The light flux controlling member according to claim 1, wherein the plurality of annular protrusions of the second emission surface, or the plurality of annular protrusions of the first emission surface and the plurality of annular protrusions of the second emission surface have a wavy shape in the cross section including the central axis.

5. The light flux controlling member according to claim 1, wherein the plurality of annular protrusions of the second emission surface, or the plurality of annular protrusions of the first emission surface and the plurality of annular protrusions of the second emission surface are formed such that a difference between a height of one protrusion and a height of another protrusion internally adjacent to the one protrusion is reduced after being increased toward the central axis from the external edge of the second emission surface.

6. A light-emitting device comprising:
   a light emitting element; and
   the light flux controlling member according to claim 1.

7. A surface light source device comprising:
   the light-emitting device according to claim 6; and
   a light diffusion member configured to allow light from the light-emitting device to pass therethrough while diffusing the light.

8. A display device comprising:
   the surface light source device according to claim 7; and
   a display member to which light emitted from the surface light source device is applied.

* * * * *